United States Patent
Costello et al.

(12) 
(10) Patent No.: US 6,822,894 B1
(45) Date of Patent: Nov. 23, 2004

(54) SINGLE EVENT UPSET IN SRAM CELLS IN FPGAS WITH LEAKY GATE TRANSISTORS

(75) Inventors: Philip D. Costello, Saratoga, CA (US); Martin L. Voogel, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 77 days.

(21) Appl. No.: 10/396,883

(22) Filed: Mar. 25, 2003

(51) Int. Cl.[7] .............................................. G11C 11/00
(52) U.S. Cl. ..................... 365/154; 365/156; 365/190
(58) Field of Search ................................ 365/154, 156, 365/190

(56) References Cited

U.S. PATENT DOCUMENTS 4,912,675 A  *  3/1990  Blake et al. ................ 365/154
6,735,110 B1 *  5/2004  Lesea ........................ 365/154

* cited by examiner

Primary Examiner—Richard Elms
Assistant Examiner—Pho M. Luu
(74) Attorney, Agent, or Firm—William L. Paradice, III; Justin Liu

(57) ABSTRACT

A memory device having single event upset (SEU) resistant circuitry includes a first inverter having an input and an output, a second inverter having an input and an output, a first transistor having a gate coupled to the input of the first inverter and having source and drain regions coupled to the output of the second inverter, and a second transistor having a gate coupled to the input of the second inverter and having source and drain regions coupled to the output of the first inverter.

23 Claims, 3 Drawing Sheets

SINGLE EVENT UPSET IN SRAM CELLS IN FPGAS WITH LEAKY GATE TRANSISTORS

FIELD OF THE INVENTION

The present invention relates generally to circuitry resistant to single event upset (SEU).

BACKGROUND OF THE INVENTION

A programmable logic device (PLD) is a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, called a field programmable gate array (FPGA), is popular because of a superior combination of capacity, flexibility, time-to-market, and cost. An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) from an external source into internal configuration memory cells that define how the CLBs, IOBs, and interconnect structure are configured. Thus, the collective states of the individual configuration memory cells determine the function of the FPGA.

A well-studied occurrence in circuitry is called Single Event Upset (SEU). SEU is an inadvertent change in state of a circuit caused by an external energy source such as, for example, cosmic rays, alpha particles, energetic neutrons, and the like. The energetic particles may randomly strike a semiconductor device and penetrate into the semiconductor device. These particle strikes create pairs of electrons and holes, which in turn cause undesirable transients that may upset circuit elements such as, for example, flipping the logic state of a latch or other memory element. As fabrication geometries and supply voltages continue to decrease, SEU problems become more severe. As a result, efforts to reduce SEU problems are increasingly important.

In a conventional DRAM or SRAM, SEU may be addressed with well-known error correction techniques. However, error correction may not be practical for FPGA configuration memory cells. For example, because an FPGA's configuration memory cells define how the FPGA's CLBs, IOBs, and interconnect structure are configured, inadvertent state changes in the configuration memory cells resulting from SEU transients may alter how the FPGA operates.

One way to remedy SEU problems in configuration memory cells is to use triple modular redundancy (TMR). With TMR, individual memory cells are replaced with three sets of memory cells and majority voter logic, where the outcome of at least two of the three sets controls FPGA operation. However, implementing TMR in an FPGA undesirably increases the size and cost of the FPGA.

Others have attempted to increase resiliency to SEU transients. For example, FIG. 1 shows an SEU-resistant memory cell 100 of the prior art. Memory cell 100 is a latch having cross-coupled inverters 102 and 104 coupled between complementary data terminals D and $\overline{D}$. Resistor R1, which is coupled between the output of inverter 102 and the input of inverter 104, delays transients caused by SEU particle strikes that change the state of inverter 102 and prevents short transients from reaching the input (and possibly changing the state) of inverter 104, which in turn gives inverter 104 more time to reset inverter 102 to its correct state. Similarly, resistor R2, which is coupled between the output of inverter 104 and the input of inverter 102, delays transients caused by SEU particle strikes at inverter 104 from reaching the input (and possibly changing the state) of inverter 102, which in turn gives inverter 102 more time to reset inverter 104 to its correct state.

To provide SEU resiliency, resistors R1 and R2 each have a resistance of between approximately 100 kilo-ohms and ten mega-ohms. Unfortunately, the formation of such large resistors may consume a relatively large amount of area and complicates integration with other structures formed using the same complementary-metal-oxide semiconductor (CMOS) processes.

Accordingly, it would be desirable and useful to provide an SEU-resistant memory circuit that consumes minimal silicon area and is suitable for integration with a CMOS process.

SUMMARY OF THE INVENTION

A latch is disclosed that includes SEU-resistant circuitry that reduces the latch's susceptibility to SEU transients without forming large resistors. In accordance with the present invention, a latch having cross-coupled inverters includes SEU-hardening resistive loads formed by transistors configured as leaky capacitors. For some embodiments, a first SEU-hardening transistor has a gate coupled to the input of a first inverter and has source and drain regions coupled to the output of a second inverter, and a second SEU-hardening transistor has a gate coupled to the input of the second inverter and has source and drain regions coupled to the output of the first inverter. The SEU-hardening transistors have relatively thin gate oxide layers that allow leakage currents between their gate and source/drain regions. These leakage currents allow the SEU-hardening transistors to appear as large resistive loads between the cross-coupled inverters. In this manner, a transient upset to one of the inverters is not readily carried to the other inverter because it is slowed by the large resistance of the SEU-hardening transistor.

The ability of the SEU-hardening transistors to appear as large resistive loads without consuming large amounts of silicon area is advantageous. By comparison, forming large resistive loads using passive resistors formed in either a polysilicon layer or in the substrate consumes much more silicon area. Further, the SEU-hardening transistors of present embodiments are easily integrated into CMOS fabrication processes.

For other embodiments, pass transistors may be added to the latch for selecting and/or addressing the latch. Also, for some embodiments, latches in accordance with present embodiments may be used as memory cells within an FPGA.

BRIEF DESCRIPTION OF THE DRAWINGS

The features and advantages of the present invention are illustrated by way of example and are by no means intended to limit the scope of the present invention to the particular embodiments shown.

Like reference numerals refer to corresponding parts throughout the drawing figures.

DETAILED DESCRIPTION

Embodiments of the present invention are disclosed below in the context of an SRAM latch for simplicity only. It is to be understood that SEU-hardening embodiments of the present invention are equally applicable to other types of circuits, including flip-flops, DRAM, and other memory elements. Additionally, the logic states of various signals described herein are exemplary and therefore may be reversed or otherwise modified as generally known in the art. Accordingly, the present invention is not to be construed as limited to specific examples described herein but rather includes within its scope all embodiments defined by the appended claims.

Figure 1:
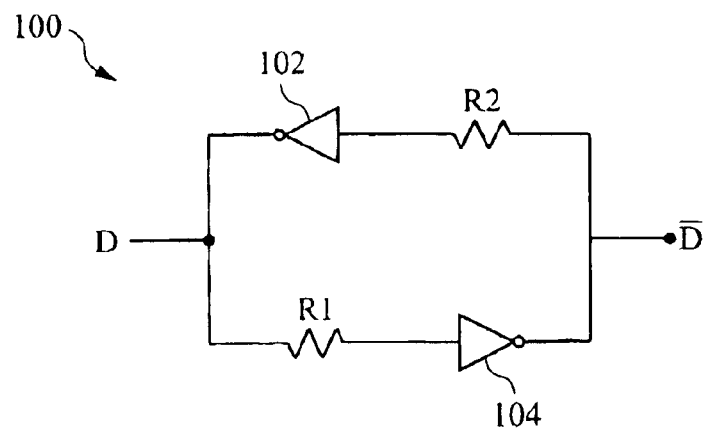
FIG. 1 is a schematic diagram of an SEU-resistant memory cell of the prior art.
Figure 2:
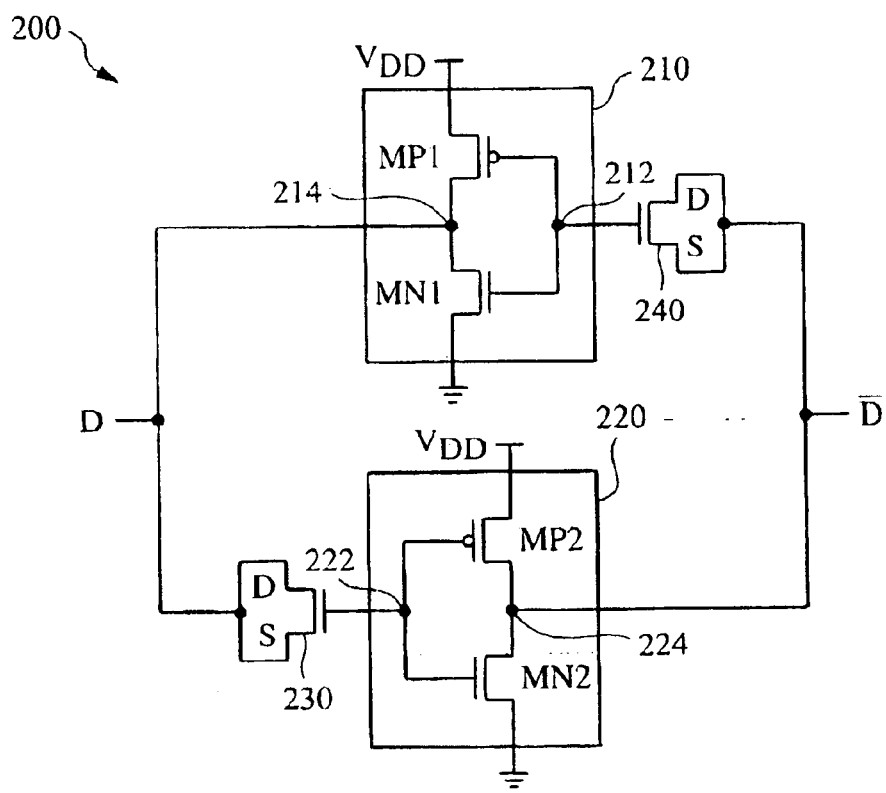
FIG. 2 is a schematic diagram of an exemplary SEU-resistant memory cell in accordance with one embodiment of the present invention.

FIG. 2 shows an exemplary embodiment of an SEU-resistant latch 200 in accordance with one embodiment of the present invention. Latch 200 includes conventional CMOS cross-coupled inverters 210 and 220 and NMOS transistors 230 and 240 coupled between complementary data terminals D and $\overline{D}$.

NMOS transistor 230 is configured as a leaky capacitor between inverter 210 and inverter 220, with the gate of transistor 230 coupled to input 222 of inverter 220, and the source S and drain D regions of transistor 230 coupled to output 214 of inverter 210. NMOS transistor 240 is configured as a leaky capacitor between inverter 220 and inverter 210, with the gate of transistor 240 coupled to input 212 of inverter 210 and the source S and drain D regions of transistor 240 coupled to output 224 of inverter 220. For other embodiments, transistors 230 and 240 may be PMOS transistors. For another embodiment, one of transistors 230 or 240 may be eliminated.

NMOS transistors 230 and 240 are SEU-hardening components that provide protection against SEU transients by slowing the RC time constant of the regenerative feedback response to particle strikes upon latch 200's SEU-sensitive regions. These SEU-sensitive regions include, for example, the drain diffusion regions of transistors MP1 and MN1 which form output 214 of inverter 210, and the drain diffusion regions of transistors MP2 and MN2 which form output 224 of inverter 220.

For some embodiments, NMOS transistor 230 has a relatively thin gate oxide layer that allows for a leakage current between transistor 230's gate and transistor 230's commonly coupled source and drain regions. This gate leakage current causes transistor 230 to appear as an SEU-hardening resistive load between output 214 of inverter 210 and input 222 of inverter 220. By increasing (i.e., slowing) the RC time constant of the path from output 214 of inverter 210 to input 222 of inverter 220, the resistive load of transistor 230 slows the propagation of undesirable SEU transients from inverter 210 to inverter 220, which in turn allows inverter 220 more time to reset inverter 210 to its correct state during transient upsets.

Similarly, PMOS transistor 240 has a relatively thin gate oxide layer that allows transistor 240 to appear as an SEU-hardening resistive load between output 224 of inverter 220 and input 212 of inverter 210.

The resistive loads of transistors 230 and 240 may be manipulated by adjusting the thickness of their respective gate oxide layers. For some embodiments, transistors 230 and 240 have a resistive load of between 100 kilo-ohms and 10 mega-ohms. For one embodiment, transistors 230 and 240 each have a resistance on the order of 1 mega-ohm.

For some embodiments, transistors that form inverters 210 and 220 of latch 200 have thicker gate oxide layers than do transistors 230 and 240, in order to minimize undesirable gate leakage currents within inverters 210 and 220. For one embodiment of latch 200 to be fabricated using a 0.1 micron process technology, transistors 230 and 240 have a channel length of 0.12 microns, a channel width of 0.12 microns, and a gate oxide layer approximately 16 Angstroms thick, PMOS transistors MP1 and MP2 have a channel length of 0.12 microns, a channel width of 0.28 microns, and a gate oxide layer approximately 22 Angstroms thick, and NMOS transistors MN1 and MN2 have a channel length of 0.12 microns, a channel width of 0.20 microns, and a gate oxide layer approximately 22 Angstroms thick.

The ability of SEU-hardening transistors 230 and 240 to appear as large resistive loads without consuming large amounts of silicon area is advantageous. By comparison, forming large resistive loads using passive resistors consumes much more silicon area. Further, because SEU-hardening transistors 230 and 240 are NMOS transistors, latch 200 may be easily integrated within CMOS fabrication processes.

In addition, embodiments of FIG. 2 are advantageous because the source/drain regions of transistors 230 and 240 are coupled to the respective outputs of inverters 210 and 240, transistors 230 and 240 do not add SEU-sensitive regions to the respective inputs of inverters 210 and 220 (although SEU-sensitive regions are added to the outputs of inverters 210 and 220). This is important because while transients resulting from particle strikes to SEU-sensitive regions at the outputs of inverters 210 and 220 are delayed by transistors 230 and 240, transients resulting from particle strikes to any newly-formed SEU-sensitive regions at the inputs of inverters 210 and 220 would not be delayed by transistors 230 and 240, and would therefore be more likely to cause inadvertent state changes in latches 210 and 220. Thus, embodiments of FIG. 2 are more advantageous than memory circuits that include load transistors having source or drain regions coupled to the inputs of the cross-coupled inverters.

Figure 3:
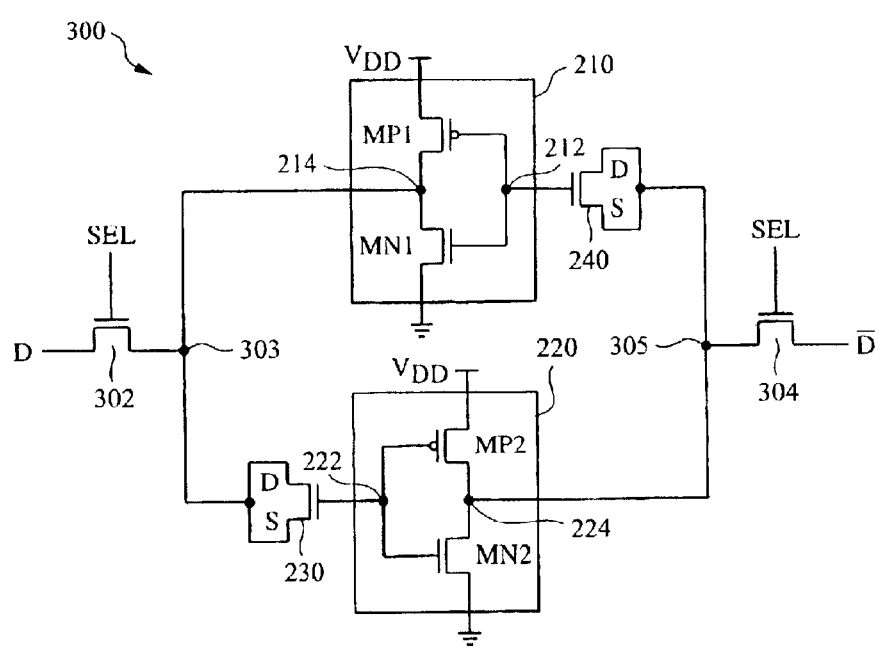
FIG. 3 is a schematic diagram of an exemplary SEU-resistant memory cell in accordance with another embodiment of the present invention.

FIG. 3 shows an exemplary latch 300 in accordance with another embodiment of the present invention. Latch 300 is similar to latch 200, with the addition of NMOS access transistors 302 and 304. For some embodiments, access transistor 302 is coupled between data terminal D and node 303, where node 303 is between inverter 210 and SEU-hardening transistor 230, and access transistor 304 is coupled between complementary data terminal $\overline{D}$ and node 305, where node 305 is between inverter 220 and SEU-hardening transistor 240. The gates of pass transistors receive a select signal SEL, which may be a select or address signal. When SEL is asserted (e.g., to logic high), pass transistors 302 and 304 couple data terminals D and $\overline{D}$ to latch 300. When SEL is de-asserted (e.g., to logic low), pass transistors 302 and 304 de-couple data terminals D and $\overline{D}$ from latch 300. For other embodiments, pass transistors 302 and 304 may be PMOS transistors. Note that the addition of pass transistors 302 and 304 do not add SEU-sensitive regions (e.g., source and drain regions) to the input of inverter 210 or inverter 220.

The large resistances attainable by transistors 230 and 240 make latches 200 and 300 well suited for use as a configuration memory cell for an FPGA. Because FPGA configuration memory cells are usually written to only during configuration of the FPGA, the write speeds for FPGA configuration memory cells are not critical during normal operation of the FPGA. As a result, the resistive loads of transistors 230 and 240 may be maximized to provide maximum SEU protection for the configuration data that controls various selectable functions of the FPGA without adversely affecting FPGA performance during normal operation. Thus, for some embodiments, latches 200 and 300 are used as configuration memory cells for an FPGA, as illustrated in FIG. 4.

Figure 4:
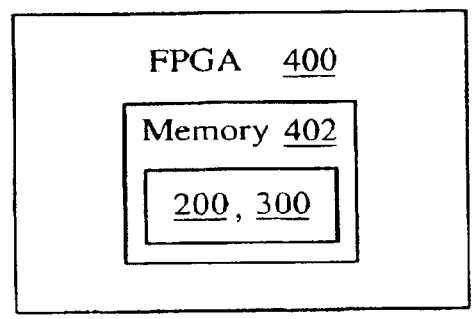
FIG. 4 is a block diagram of an embodiment of an FPGA in accordance with one embodiment of the present invention.

FIG. 4 shows an FPGA 400 in accordance with one embodiment of the present invention. FPGA 400 includes a memory 402, which includes one or more of latches 200 and/or 300. For one embodiment, memory 402 includes FPGA configuration memory cells, although in other embodiments memory 400 may include other memory elements such as, for example, block RAM. Further, although memory 402 is shown internal to FPGA 400, in other embodiments memory 402 may be external to FPGA 400 and coupled thereto for communication of data, address and control information.

While the foregoing is directed to the preferred embodiment of the present invention, other and further embodiments of the invention may be devised without departing from the basic scope thereof, and the scope thereof is determined by the claims that follow.

What is claimed is:

1. A memory device having single event upset (SEU) resistant circuitry, comprising:
   a first inverter having an input and an output;
   a second inverter having an input and an output;
   a first transistor having a gate coupled to the input of the first inverter and having source and drain regions coupled to the output of the second inverter; and
   a second transistor having a gate coupled to the input of the second inverter and having source and drain regions coupled to the output of the first inverter.

2. The memory device of claim 1, wherein the first and second transistors each provide an SEU-hardening resistive load of between approximately 100 kilo-ohms and 10 mega-ohms.

3. The memory device of claim 1, wherein the first and second transistors comprise leaky capacitors.

4. The memory device of claim 1, wherein the first and second transistors each conduct a gate leakage current.

5. The memory device of claim 1, wherein the memory device comprises a configuration memory cell in a field programmable gate array.

6. The memory device of claim 1, wherein the first and second transistors comprise NMOS transistors.

7. The memory device of claim 1, wherein the first and second transistors comprise PMOS transistors.

8. The memory device of claim 1, wherein the first and second transistors have a layer of gate oxide approximately 16 Angstroms thick, and the first and second inverters include transistors that have a layer of gate oxide approximately 22 Angstroms thick.

9. The memory device of claim 1, wherein the first and second transistors have a layer of gate oxide thinner than a gate oxide used in the first and second inverters.

10. A field programmable gate array (FPGA) including a plurality of configuration memory cells having single event upset (SEU) protection, each of the configuration memory cells comprising:
    a first inverter having an input and an output;
    a second inverter having an input and an output;
    a first transistor having a gate coupled to the input of the first inverter and having source and drain regions coupled to the output of the second inverter; and
    a second transistor having a gate coupled to the input of the second inverter and having source and drain regions coupled to the output of the first inverter.

11. The FPGA of claim 10, wherein the first and second transistors each provide an SEU-hardening resistive load of between approximately 10 kilo-ohms and 10 mega-ohms.

12. The FPGA of claim 10, wherein the first and second transistors comprise leaky capacitors.

13. The FPGA of claim 10, wherein the first and second transistors each conduct a gate leakage current.

14. The FPGA of claim 10, wherein the first and second transistors comprise NMOS transistors.

15. The FPGA of claim 10, wherein the first and second transistors comprise PMOS transistors.

16. The FPGA of claim 10, wherein the first and second transistors have a layer of gate oxide approximately 16 Angstroms thick, and the first and second inverters include transistors that have a layer of gate oxide approximately 22 Angstroms thick.

17. The FPGA of claim 10, wherein the first and second transistors have a layer of gate oxide thinner than a gate oxide used in the first and second inverters.

18. The method of claim 17, wherein the first and second transistors provide a resistive load of between approximately 10 kilo-ohms and 10 mega-ohms.

19. The method of claim 17, further comprising:
    facilitating gate leakage currents in each of the first and second transistors.

20. The method of claim 18, wherein the facilitating comprises providing a relatively thin layer of gate oxide for the first and second transistors.

21. The method of claim 17, wherein the first and second transistors comprise NMOS transistors.

22. The method of claim 17, wherein the first and second transistors comprise PMOS transistors.

23. A method of providing a single event upset resistant memory cell, comprising:
    providing a first inverter;
    providing a second inverter;
    coupling a first transistor between the first inverter and the second inverter, the first transistor having a gate coupled to an input of the first inverter and having source and drain regions coupled to an output of the second inverter; and
    coupling a second transistor between the second inverter and the first inverter, the second transistor having a gate coupled to an input of the second inverter and having source and drain regions coupled to an output of the first inverter.

* * * * *